United States Patent
Matsudai et al.

(10) Patent No.: US 11,217,686 B2
(45) Date of Patent: Jan. 4, 2022

(54) SEMICONDUCTOR DEVICE AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventors: Tomoko Matsudai, Shibuya Tokyo (JP); Yoko Iwakaji, Meguro Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/995,039

(22) Filed: Aug. 17, 2020

(65) Prior Publication Data
US 2021/0296476 A1    Sep. 23, 2021

(30) Foreign Application Priority Data

Mar. 19, 2020 (JP) .............................. JP2020-050275

(51) Int. Cl.
*H01L 29/739* (2006.01)

(52) U.S. Cl.
CPC .................. *H01L 29/7397* (2013.01)

(58) Field of Classification Search
CPC .................................................. H01L 29/7397
USPC ........................................................ 257/139
See application file for complete search history.

(56) References Cited

U.S. PATENT DOCUMENTS

| 4,980,743 | A |  | 12/1990 | Nakagawa et al. |
| 5,381,026 | A | * | 1/1995 | Shinohe ............ H01L 29/42308 257/147 |
| 10,319,844 | B2 | * | 6/2019 | Kitagawa .............. H01L 21/743 |
| 2017/0250269 | A1 |  | 8/2017 | Sumitomo et al. |
| 2018/0083129 | A1 | * | 3/2018 | Kitagawa ............ H01L 29/7397 |
| 2019/0103479 | A1 |  | 4/2019 | Suzuki et al. |
| 2019/0214383 | A1 |  | 7/2019 | Nagai |

(Continued)

FOREIGN PATENT DOCUMENTS

| JP | S64-57674 A | 3/1989 |
| JP | H07-83120 B2 | 9/1995 |

(Continued)

*Primary Examiner* — Igwe U Anya
(74) *Attorney, Agent, or Firm* — Allen & Overy, LLP

(57) ABSTRACT

A semiconductor device according to an embodiment including: a semiconductor layer having a first plane and a second plane, the semiconductor layer including: a first trench on the first plane; a second trench on the second plane; a first conductivity first semiconductor region; a second conductivity type second semiconductor region between the first semiconductor region and the first plane; a first conductivity type third semiconductor region between the second semiconductor region and the first plane; a second conductivity type fourth semiconductor region between the third semiconductor region and the first plane; and a first conductivity type fifth semiconductor region provided between the second trench and the third semiconductor region in contact with the second trench; a first gate electrode in the first trench; a second gate electrode in the second trench; a first electrode on the first plane; and a second electrode on the second plane.

10 Claims, 12 Drawing Sheets

(56) References Cited

U.S. PATENT DOCUMENTS

2020/0091323 A1 3/2020 Iwakaji et al.
2020/0303524 A1 9/2020 Matsudai et al.

FOREIGN PATENT DOCUMENTS

| JP | 2016-29710 A | 3/2016 |
| JP | 2019-67890 A | 4/2019 |
| JP | 2019-125595 A | 7/2019 |
| JP | 2020-47789 A | 3/2020 |
| JP | 2020-155472 A | 9/2020 |

* cited by examiner

SEMICONDUCTOR DEVICE AND SEMICONDUCTOR CIRCUIT

CROSS-REFERENCE TO RELATED APPLICATION

This application is based upon and claims the benefit of priority from Japanese Patent. Application No. 2020-050275, filed on Mar. 19, 2020, the entire contents of which are incorporated herein by reference.

FIELD

Embodiments described herein relate generally to a semiconductor device and a semiconductor circuit.

BACKGROUND

As an example of a power semiconductor device, there is an insulated to bipolar transistor (IGBT) having a trench gate structure. In a trench gate structure IGBT, a p-type collector region, an n-type drift region, and a p-type base region are provided, for example, on a collector electrode. Then, a gate electrode is provided in the trench penetrating the p-type base region and reaching the n-type drift region with the gate insulating film-interposed therebetween. Furthermore, an n-type emitter region connected to an emitter electrode is provided in a region adjacent to the trench on the frontside of the p-type base region.

In the above-mentioned IGBT, by applying a positive voltage higher than a threshold voltage to the gate electrode, a channel is formed in the p-type base region. Then, electrons are injected front the n-type emitter region to the n-type drift region, and holes are injected front the p-type collector region to the n-type drift region. As a result, an on-current having electrons and holes as carriers is flown between the collector electrode and the emitter electrode.

In order to realize low power consumption of the IGBT, it is preferable to reduce losses such as steady loss and turn-off loss.

DETAILED DESCRIPTION

Figure 1:
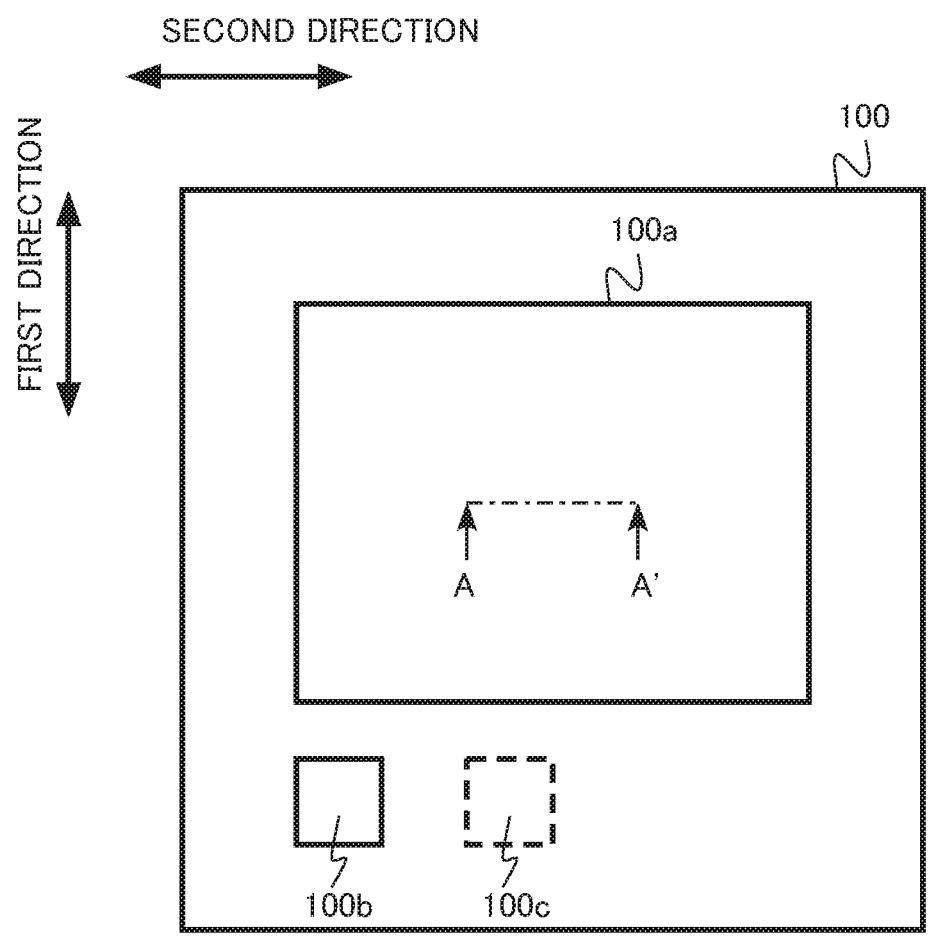
FIG. 1 is a schematic diagram of a semiconductor device according to a first embodiment.

A semiconductor device according to an embodiment includes: a semiconductor layer including a first plane and a second plane facing the first plane, the semiconductor layer including: at least one first trench provided on a side of the first plane; at least one second trench provided on a side f the second plane; a first semiconductor region of a first conductivity type being in contact with the second plane; a second semiconductor region of a second conductivity type provided between the first semiconductor region and the first plane; a third semiconductor region of the first conductivity type provided between the second semiconductor region and the first plane; a fourth semiconductor region of the second conductivity type provided between the third semiconductor region and the first plane; and a fifth semiconductor region of the first conductivity type provided between the at least one second trench and the third semiconductor region, being separated from the third semiconductor region and the first semiconductor region, and being in contact with the at least one second trench; a first gate electrode provided in the at least one first trench; a first gate insulating film provided between the first gate electrode and the second semiconductor region, between the first gate electrode and the third semiconductor region, and between the first gate electrode and the fourth semiconductor region; a second gate electrode provided in the at least one second trench; a second gate insulating film provided between the second gate electrode and the first semiconductor region, and between the second gate electrode and the fifth semiconductor region; a first electrode provided on the side of the first plane of the semiconductor layer and being electrically connected to the fourth semiconductor region; and a second electrode provided on the side of the second plane of the semiconductor layer and being electrically connected to the first semiconductor region.

Hereinafter, embodiments will be described with reference to the drawings. In the following description, the same or similar members and the like will be denoted by the same reference numerals, and the description of the members and the like once described will be appropriately omitted.

In this specification, notations of $n^+$-type, n-type, and $n^-$-type denote that the impurity concentration of the n-type is lowered in the order of $n^+$-type, n-type, and $n^-$-type. In addition, notations of $p^+$-type, p-type, and $p^-$-type denote that the impurity concentration of the p-type is lowered in the order of $p^+$-type, p-type, and $p^-$-type.

In this specification, the distribution and absolute values of the impurity concentrations in the semiconductor regions can be measured by using, for example, secondary ion mass spectrometry (SIMS). In addition, the relative magnitude relationship between the impurity concentrations of the two semiconductor regions can be determined by using, for example, scanning capacitance microscopy (SCM). The distribution and absolute values of the impurity concentrations can be measured by using, for example, a spreading resistance analysis (SRA) method. In the SCM and the SBA, the relative magnitude relationship and the absolute values of the carrier concentrations in the semiconductor regions can be obtained. By assuming the activation rate of the impurities, the relative magnitude relationship between the impurity concentrations of two semiconductor regions, the distribution of the impurity concentrations, and the absolute values of the impurity concentrations can be obtained from the measurement results of the SCM and the SRA.

First Embodiment

A semiconductor device according to a first embodiment includes a semiconductor layer having a first plane and a second plane facing the first plane, the semiconductor layer including: a first trench being provided on a side of the first plane; a second trench being provided on a side of the second plane; a first semiconductor region of a first conductivity type being in contact with the second plane; a second semiconductor region of a second conductivity type being provided between the first semiconductor region and the first plane; a third semiconductor region of the first conductivity type being provided between the second semiconductor region and the first plane; a fourth semiconductor region of the second conductivity type being provided between the third semiconductor region and the first plane; and a fifth semiconductor region of the first conductivity type being provided between the second trench and the third semiconductor region, being separated from the third semiconductor region and the first semiconductor region, and being in contact with the second trench. And, the semiconductor device includes a first gate electrode being provided in the first trench; a first gate insulating film being provided between the first gate electrode and the second semiconductor region, between the first gate electrode and the third semiconductor region, and between the first gate electrode and the fourth semiconductor region; a second gate electrode being provided in the second trench; a second gate insulating film being provided between the second gate electrode and the first semiconductor region, and between the second gate electrode and the fifth semiconductor region; a first electrode being provided on the side of the first plane of the semiconductor layer and being electrically connected to the fourth semiconductor region; and a second electrode being provided on the side of the second plane of the semiconductor layer and being electrically connected to the first semiconductor region.

The semiconductor device according to the first embodiment is an IGBT 100 having a double-sided gate structure having gate electrodes on the frontside and backside of a semiconductor layer. In addition, the IGBT 100 has a trench gate structure in which frontside and backside gate electrodes are provided in a trench. Hereinafter, a case where the first conductivity type is p-type and the second conductivity type is n-type will be described as an example.

FIG. 1 is a schematic diagram of the semiconductor device according to the first embodiment. FIG. 1 is a layout diagram of a semiconductor chip of the IGBT 100. The IGBT 100 includes a transistor region 100a, a frontside gate electrode pad 100b, and a backside gate electrode pad 100c. The backside gate electrode pad 100c is located on the opposite surface side of the semiconductor chip with respect to the frontside gate electrode pad 100b.

Figure 2:
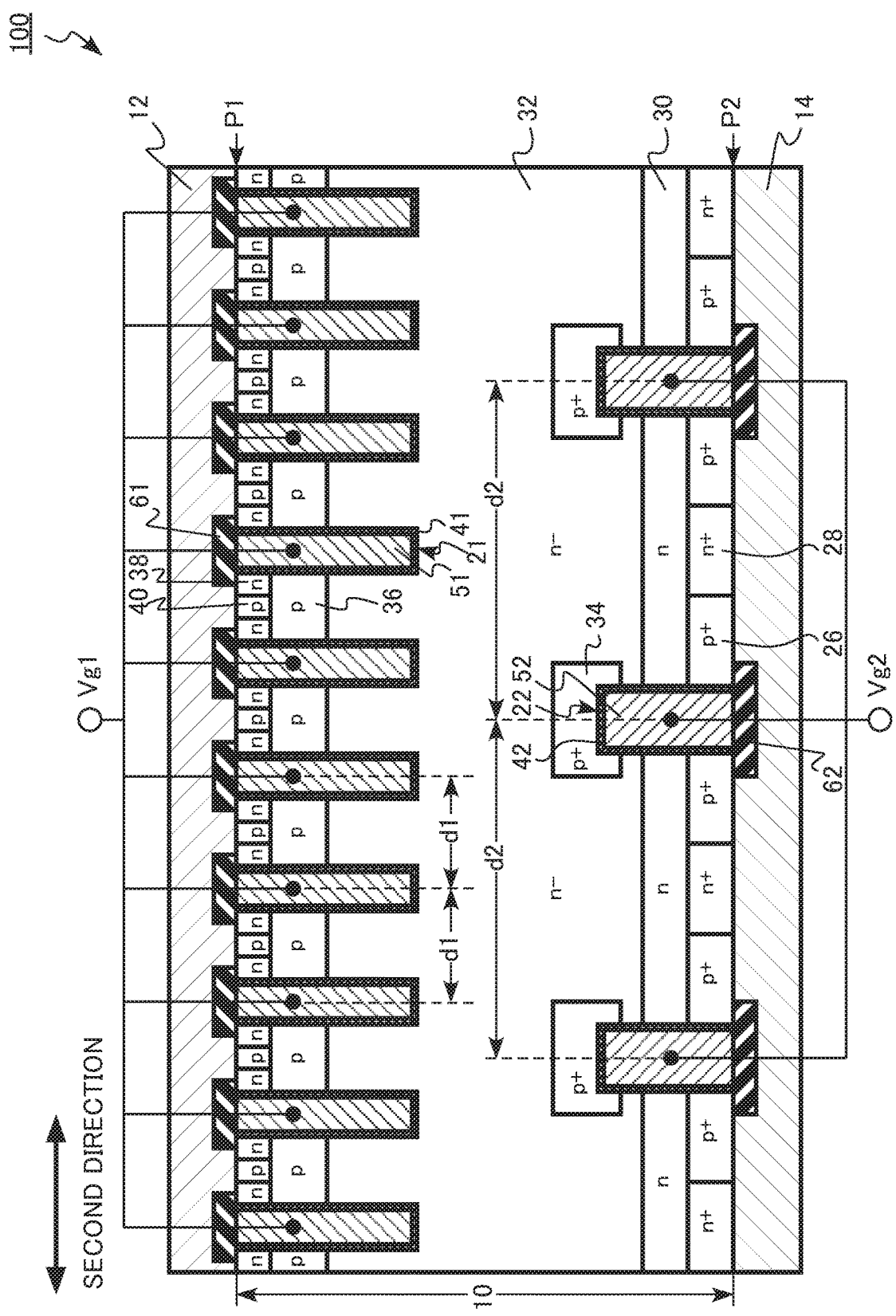
FIG. 2 is a schematic cross-sectional diagram of a portion of the semiconductor device according to the first embodiment.
Figure 3:
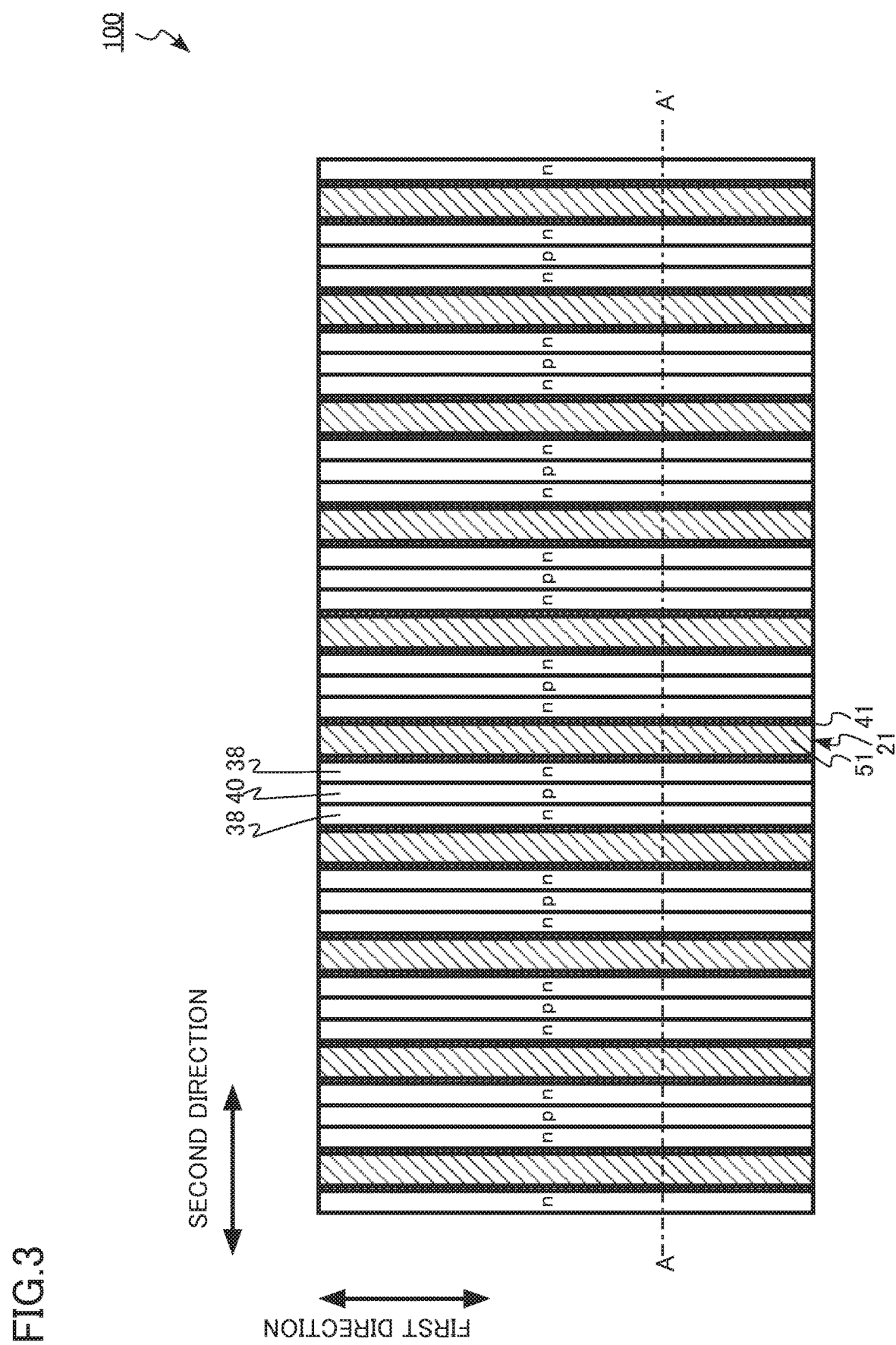
FIG. 3 is a schematic plan diagram of a portion of the semiconductor device according to the first embodiment.
Figure 4:
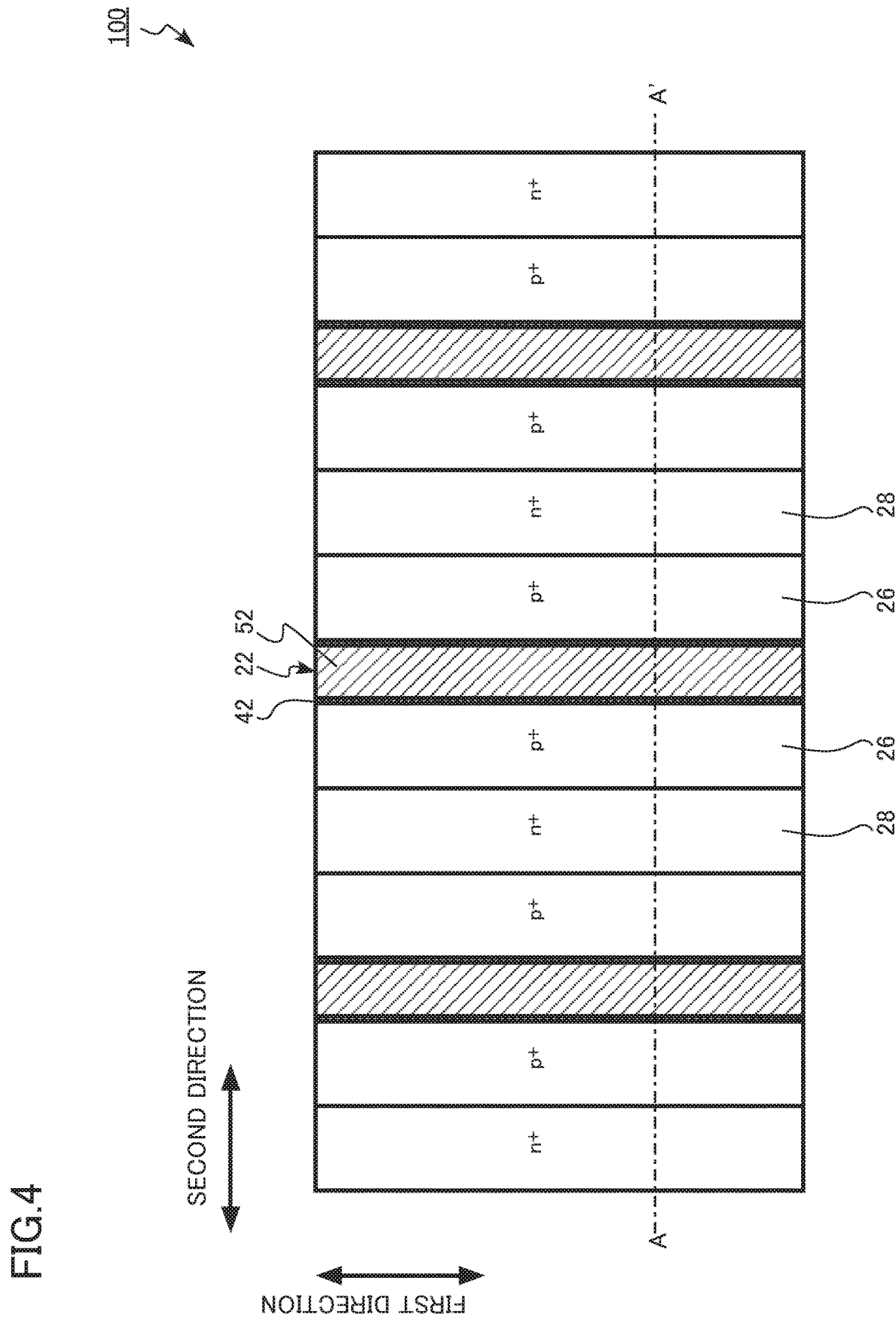
FIG. 4 is a schematic plan diagram of a portion of the semiconductor device according to the first embodiment.

FIG. 2 is a schematic cross-sectional diagram of a portion of the semiconductor device according to the first embodiment. FIGS. 3 and 4 are schematic plan diagrams of a portion of the semiconductor device according to the first embodiment. FIG. 2 illustrates a cross section taken along the line AA' of FIGS. 1 and 3. FIG. 3 is a plan diagram of a frontside, that is, a first plane P1 of the semiconductor layer. FIG. 4 is a plan diagram of a backside, that is, a second plane P2 of the semiconductor layer.

The IGBT 100 according to the first embodiment includes a semiconductor layer 10, an emitter electrode 12 (first electrode), a collector electrode 14 (second electrode), a frontside gate insulating film 41 (first gate insulating film), a backside gate insulating film 42 (second gate insulating film), a frontside gate electrode 51 (first gate electrode), a backside gate electrode 52 (second gate electrode), a first interlayer insulating layer 61, and a second interlayer insulating layer 62.

In the semiconductor layer 10, a frontside gate trench 21 (first trench), a backside gate trench 22 (second trench), a p-type collector region 26 (first semiconductor region), an n-type collector region. 28 (sixth semiconductor region), a buffer region 30 (seventh semiconductor region), a drift region 32 (second semiconductor region), a p-type floating region 34 (fifth semiconductor region), a base region 36 (third semiconductor region), an emitter region 38 (fourth semiconductor region), and a contact region 40 are provided.

The semiconductor layer 10 has a first plane P1 and a second plane P2 facing the first plane P1. The semiconductor layer 10 is made of, for example, single crystal silicon. The film thickness of the semiconductor layer 10 is, for example, 40 µm or more and 700 µm or less.

In this specification, one direction parallel to the first plane P1 is referred to as a first direction. In addition, a direction parallel to the first plane P1 and perpendicular to the first direction is referred to as a second direction.

The emitter electrode 12 is provided on a side of the first plane P1 of the semiconductor layer 10. At least a portion of the emitter electrode 12 is in contact with the first plane P1 of the semiconductor layer 10.

The emitter electrode 12 functions as an emitter electrode of the IGBT 100.

The emitter electrode 12 is made of, for example, a meta_. The emitter electrode 12 contains, for example, at least one metal or semiconductor selected from a group consisting of aluminum (Al), titanium. (Ti), nickel (Ni) tungsten (W), gold (Au), and polycrystalline silicon (Si).

The emitter electrode 12 is electrically connected to the emitter region 38. The emitter electrode 12 is electrically connected to the contact region 40. The emitter electrode 12 is electrically connected to the base region 36 through the contact region 40.

The collector electrode 14 is provided on a side of the second plane P2 of the semiconductor layer 10. At least a portion of the collector electrode 14 is in contact with the second plane P2 of the semiconductor layer 10.

The collector electrode 14 is made of, for example, a metal. The collector electrode 14 contains, for example, at least one metal or semiconductor selected from a group consisting of aluminum (Al), titanium. (Ti), nickel (Ni), tungsten (N), gold (Au), and polycrystalline silicon (Si).

The collector electrode 14 is electrically connected to the p-type collector region 26 and the n-type collector region 28.

The frontside gate trench 21 is provided on the side of the first plane P1 of the semiconductor layer 10. The frontside gate trench 21 is provided in contact with the base region 36.

The frontside gate trench 21 is a groove provided in the semiconductor layer 10. The frontside gate trench 21 is a portion of the semiconductor layer 10.

As illustrated in FIG. 3, the frontside gate trench 21 extends on the first, plane P1 in the first direction parallel to the first plane P1. The frontside gate trench 21 has a stripe shape. The plurality of frontside gate trenches 21 are repeatedly disposed in the second direction perpendicular to the first direction.

The frontside gate trench 21 penetrates the base region 36 and reaches the drift region 32. The depth of the frontside gate trench 21 based on the first plane P1 as a reference is, for example, 8 μm or less.

The backside gate trench 22 is provided on the side of the second plane P2 of the semiconductor layer 10. The backside to trench 22 is provided in contact with the buffer region 30 and the drift region 32.

The backside gate trench 22 is a groove provided in the semiconductor layer 10. The backside gate trench 22 is a portion of the semiconductor layer 10.

As illustrated in FIG. 4, the backside gate trench 22 extends on the second plane P2 in the first direction parallel to the second plane P2. The backside gate trench 22 has a stripe shape. The plurality of backside gate trenches 22 are repeatedly disposed in the second direction perpendicular to the first direction.

The backside gate trench 22 penetrates the buffer region 30 and reaches the drift region 32. The depth of the backside gate trench 22 based on the second plane P2 as a reference is, for example, 8 μm or less. The width of the backside gate trench 22 in the second direction is, for example, larger than the width of the frontside gate trench 21 in the second direction.

A pith of the backside gate trenches 22 in the second direction (d2 in FIG. 2) may be larger than a pitch of the frontside gate trenches 21 in the second direction (d1 in FIG. 2). The pitch of the frontside gate trenches 21 in the second direction is a distance between centers of two adjacent frontside to trenches 21. And, the pitch of the backside gate trenches 22 in the second direction is a distance between centers of two adjacent backside gate trenches 22.

The p-type collector region 26 is a $p^+$-type semiconductor region. The p-type collector region 26 is in contact with the second plane P2. The p-type collector region 26 is electrically connected to the collector electrode 14. The p-type collector region. 26 is in contact with the collector electrode 14. The p-type collector region 26 serves as a hole supply source at the time of the ON state of the IGBT 100.

The n-type collector region 28 is an n'-type semiconductor region. The n-type collector region 28 is in contact with the second plane P2. The n-type collector region 28 is provided adjacent to the p-type collector region 26. The n-type collector region 28 is electrically connected to the collector electrode 14. The n-type collector region 28 is in contact with the collector electrode 14. The n-type collector region 28 serves as a path of the electrons to flow from the drift region 32 to the collector electrode 14 at the time of turn-on operation of the IGBT 100.

The buffer region 30 is an n-type semiconductor region. The buffer region 30 is provided between the p-type collector region 26 and the first plane P1. The buffer region 30 is provided between the p-type collector region 26 and the drift region 32. The buffer region 30 is provided between the n-type collector region 28 and the first plane P1. The buffer region 30 is provided between the n-type collector region 28 and the drift region 32.

The n-type impurity concentration of the buffer region 30 is higher than the n-type impurity concentration of the drift region 32. The n-type impurity concentration of the buffer region 30 is lower than the n-type impurity concentration of the n-type collector region 28.

The buffer region 30 has a function of suppressing the IGBT 100 from being in the punch-through state in the OFF state of the IGBT 100. The extension of the depletion layer extending from a side of the base region 36 to the drift region 32 is suppressed in the buffer region 30. For example, by increasing the thickness of the drift region 32, the buffer region 30 may also be omitted.

The drift region 32 is an $n^-$-type semiconductor region. The drift region 32 is provided between the p-type collector region 26 and the first plane P1. The drift region 32 is provided between the buffer region 30 and the base region 36.

The n-type impurity concentration of the drift region 32 is lower than the n-type impurity concentration of the buffer region 30.

The drift region 32 serves as a path of the ON-current at the time of the ON state of the IGBT 100. The drift region 32 has a function of being depleted at the time of the OFF state of the IGBT 100 and maintaining the breakdown voltage of the IGBT 100.

The base region 36 is a p-type semiconductor region. The base region 36 is provided between the drift region 32 and the first plane P1. The base region 36 is in contact with the drift region 32.

The depth of the base region 36 based on the first plane P1 as a reference is, for example, 8 μm or less. An n-type inversion layer is formed in the region of the base region 36 facing the frontside gate electrode 51 at the time of the ON state of the IGBT 100. The base region 36 functions as a channel region of the transistor.

The emitter region 38 is an $n^+$-type semiconductor region. The emitter region 38 is provided between the base region 36 and the first plane P1. The emitter region 38 extends in the first direction on the first plane P1.

The emitter region 38 is in contact with the frontside gate insulating film 41.

The n-type impurity concentration of the emitter region 38 is higher than the n-type impurity concentration of the drift region 32.

The emitter region 38 is electrically connected to the emitter electrode 12. The emitter region 38 is in contact with the emitter electrode 12. The emitter region 38 serves as an electron supply source at the time of the ON state of the IGBT 100.

The contact region 40 is a $p^+$-type semiconductor region. The contact region 40 is provided between the base region 36 and the first plane P1.

The contact region 40 extends in the first direction on the first plane P1. The contact region 40 is electrically connected to the emitter electrode 12.

The p-type impurity concentration of the contact region 40 is higher than the p-type impurity concentration of the base region 36.

The p-type floating region 34 is a $p^+$-type semiconductor region. The p-type floating region 34 is provided between the backside gate trench 22 and the base region 36. The p-type floating region 34 is provided between the backside gate trench. 22 and the drift region 32.

The p-type floating region 34 is separated from the base region 36. The p-type floating region 34 is separated from the p-type collector region 26.

The p-type floating region 34 is in contact with the backside gate trench 22. The p-type floating region 34 covers the corner of the backside gate trench 22. The p-type floating region 34 is in contact with the bottom and portions of the side surfaces of the backside gate trench 22.

For example, the p-type impurity concentration of the p-type floating region 34 is higher than the p-type impurity concentration of the base region 36.

The p-type floating region 34 becomes a portion of the hole supply source at the time of the ON state of the IGBT 100.

The frontside gate electrode 51 is provided in the frontside gate trench 21. The frontside gate electrode 51 is made of, for example, a semiconductor or a metal. The frontside gate electrode 51 is made of, for example, an amorphous silicon containing n-type impurities or p-type impurities or a polycrystalline silicon containing n-type impurities or p-type impurities.

The frontside gate electrode 51 is electrically connected to the frontside gate electrode pad. 100*b*. A first gate voltage (Vg1) is applied to the frontside gate electrode pad 100*b*. The first gate voltage (Vg1) is applied to the frontside gate electrode 51.

The frontside gate insulating film 41 is provided between the frontside gate electrode 51 and the semiconductor layer 10. The frontside gate insulating film 41 is provided between the frontside gate electrode 51 and the drift region 32, between the frontside gate electrode 51 and the base region 36, and between the frontside gate electrode 51 and the emitter region 38. The frontside gate insulating film 41 is in contact with the drift region 32, the base region 36, and the emitter region 38. The frontside gate insulating film 41 is made of, for example, a silicon oxide.

The backside gate electrode 52 is provided in the backside gate trench 22. The backside gate electrode 52 is made of, for example, a semiconductor or a metal. The backside gate electrode 52 is made of, for example, an amorphous silicon containing n-type impurities or p-type impurities or a polycrystalline silicon containing n-type impurities or p-type impurities.

The backside gate electrode 52 is electrically connected to the backside gate electrode pad 100*c*. A second gate voltage (Vg2) is applied to the backside gate electrode pad 1100*c*. The second gate voltage (Vg2) is applied to the backside gate electrode 52.

The backside gate insulating film 42 is provided between the backside gate electrode 52 and the semiconductor layer 10. The backside gate insulating film 42 is provided between the backside gate electrode 52 and the p-type collector region 26, between the backside gate electrode 52 and the buffer region 30, between the backside gate electrode 52 and the drift region 32, and between the backside gate electrode 52 and the p-type floating region 34.

The backside gate insulating film 42 is in contact with the p-type collector region 26, the buffer region 30, the drift region 32, and the p-type floating region 34. The backside gate insulating film 42 is made of, for example, a silicon oxide.

The first interlayer insulating layer 61 is provided between the frontside gate electrode 51 and the emitter electrode 12. The first interlayer insulating layer 61 electrically isolates the frontside gate electrode 51 and the emitter electrode 12. The first interlayer insulating layer 61 is made of, for example, a silicon oxide.

The second interlayer insulating layer 62 is provided between the backside gate electrode 52 and the collector electrode 14. The second interlayer insulating layer 62 electrically isolates the backside gate electrode 52 and the collector electrode 14. The second interlayer insulating layer 62 is made of, for example, a silicon oxide.

Next, a driving method for the IGBT 100 will be described.

Figure 5:
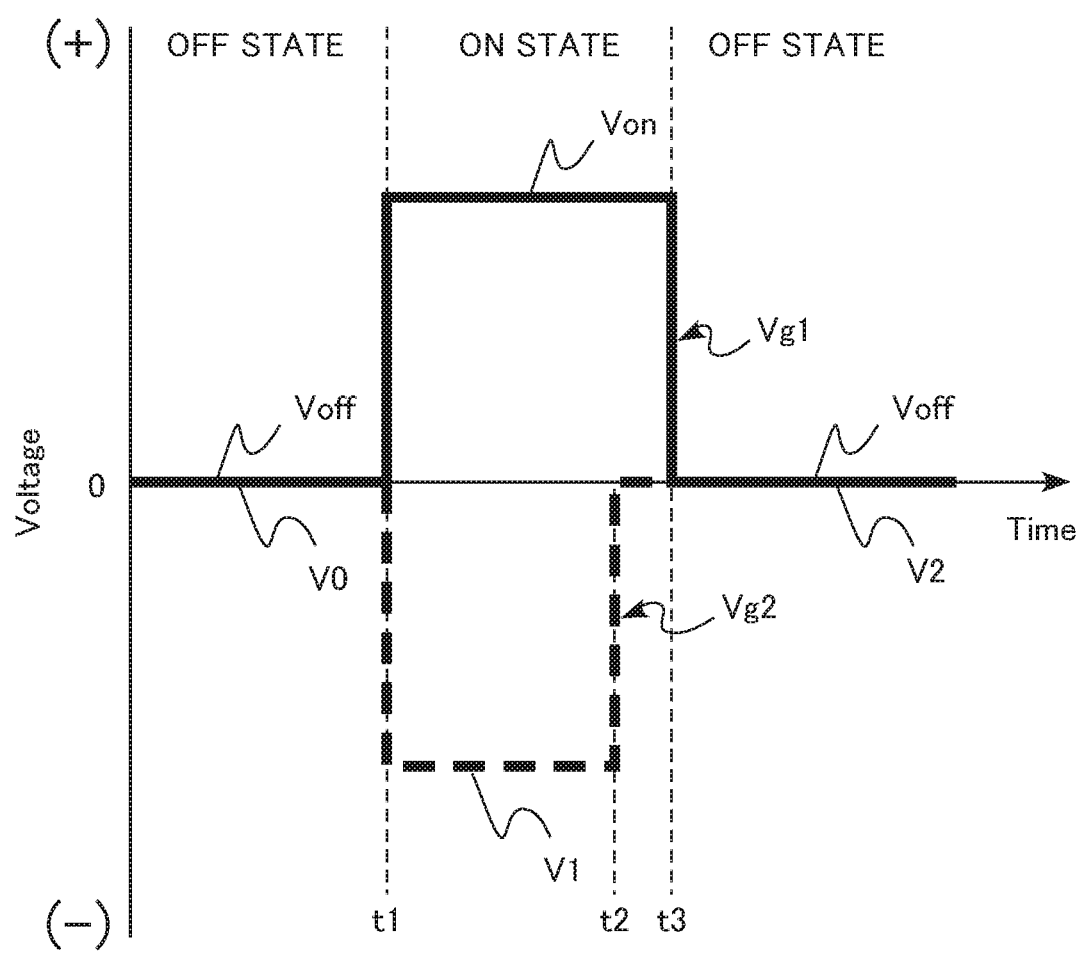
FIG. 5 is an explanatory diagram of a driving method for the semiconductor device according to the first embodiment.

FIG. 5 is an explanatory diagram of a driving method for the semiconductor device according to the first embodiment. FIG. 5 is a timing chart of the first gate voltage (Vg1) applied to the frontside gate electrode pad 100*b* and the second gate voltage (Vg2) applied to the backside gate electrode pad 100*c*.

Hereinafter, for the convenience of operation description, a transistor having the frontside gate electrode 51 will be described.

In the OFF state of the IGBT 100, for example, the emitter voltage is applied to the emitter electrode 12. The emitter voltage is, for example, 0 V. The collector voltage is applied to the collector electrode 14. The collector voltage is, for example, 200 V or more and 6500 V or less.

In the OFF state of the IGBT 100, the turn-off voltage (Voff) is applied to the frontside gate electrode pad 100*b*. The first gate voltage (Vg1) becomes the turn-off voltage (Voff). Therefore, the turn-off voltage (Voff) is also applied to the frontside gate electrode 51.

The turn-off voltage (Voff) is a voltage lower than the threshold voltage at which the transistor having the frontside gate electrode 51 is not in the turned-on state and is, for example, 0 V or a negative voltage. [008:3] In the OFF state, an n-type inversion layer is not formed to face the frontside gate electrode 51 in the base region 36 being in contact with the frontside gate insulating film 41.

In the OFF state of the IGBT 100, an initial voltage (V0) is applied to the backside gate electrode pad 100*c*. The second gate voltage (Vg2) becomes the initial voltage (V0). Therefore, the initial voltage (V0) is also applied to the backside gate electrode 52.

The initial voltage (V0) is, for example, a voltage at which a p-type inversion layer is not formed in the buffer region 30 and the drift region 32 facing the backside gate electrode 52 and being in contact with the backside gate insulating film 42. The initial voltage (U) is a voltage higher than the threshold voltage at which the p-type inversion layer is formed in the buffer region 30 and the drift region 32. The initial voltage (V0) is, for example, 0 V or a positive voltage.

In the OFF state, the p-type inversion layer is not formed in the buffer region 30 and the drift region. 32 which are in contact with the backside gate insulating film 42. For this reason, the p-type collector region 26 and the p-type floating region 34 electrically isolated. For this reason, the electric potential of the p-type floating region 34 is floating.

In the OFF state of the IGBT 100, no current flows between the collector electrode 14 and the emitter electrode 12.

When the IGBT 100 is set to be in the turned-on state (time t1 in FIG. 5), the turn-on voltage (Von) is applied to the frontside gate electrode pad 100*b*. The first gate voltage (Vg1) becomes the turn-on voltage (Von). The turn-on voltage (Von) is also applied to the frontside gate electrode 51.

The turn-on voltage (Von) is a positive voltage exceeding the threshold voltage of the transistor having the frontside gate electrode 51. The turn-on voltage (Von) is, for example, 15 V. By applying the turn-on voltage (Von) to the frontside gate electrode 51, the transistor having the frontside gate electrode 51 is in the turned-on state.

When the IGBT 100 is set to be in the turned-on state (time t1 in FIG. 5), the first voltage (V1) is applied to the backside gate electrode 100*c*. The second gate voltage (Vg2) becomes the first voltage (V1). Therefore, the first voltage (V1) is also applied to the backside gate electrode 52.

In addition, in FIG. 5, a case where the time when the turn-on voltage (Von) is applied to the frontside gate electrode pad 100*b* and the time when the first voltage (V1) is applied to the backside gate electrode pad 100*c* are the same has been described as an example, but the two times may not be the same. One time may be before the other time.

The first voltage (V1) is a voltage at which the p-type inversion layer is formed in the buffer region 30 facing the backside gate electrode 52 and the drift region 32 facing the backside gate electrode 52 which are in contact with the backside gate insulating film 42. The first voltage (V1) is a negative voltage. The first voltage (V1) is, for example, equal to or higher than −15 V and lower than 0 V.

By applying the first voltage (V1) to the backside gate electrode 52, the p-type inversion layer is formed in the buffer region 30 and the drift region 32 which are in contact with the backside gate insulating film 42. Therefore, the p-type collector region 26 and the p-type floating region 34 are electrically connected to each other.

In the ON state of the IGBT 100, the p-type collector region. 26 and the p-type floating region 34 are electrically connected to each other. For this reason, the electric potential of the p-type floating region 34 becomes the same as the electric potential of the p-type collector region 26.

Therefore, similarly to the p-type collector region, the p-type floating region 34 also functions as a hole injection region. In the ON state of the IGBT 100, the on-current flows between the collector electrode 14 and the emitter electrode 12 even by passing through the p-type floating region 34 together with the p-type collector region 26.

At the time of setting the IGBT 100 to be in the turned-off state (time t3 in FIG. 5), a turn-off voltage (Voff) is applied to the frontside gate electrode pad 100*b*. The first gate voltage (Vg1) becomes the turn-off voltage (Voff). The turn-off voltage (Voff) is also applied to the front side gate electrode 51.

For example, before the first gate voltage (Vg1) is changed from the turn-on voltage (Von) to the turn-off voltage (Voff), that is, before the time t3, the second gate voltage (Vg2) is changed from the first voltage (V1) to the second voltage (V2). The voltage applied to the backside gate electrode pad 100*c* is changed from the first voltage (V1) to the second voltage at the time t2.

The second voltage (V2) is the initial voltage (V0). The initial voltage (V0) is also applied to the backside gate electrode 52. The initial voltage (V0) is a voltage higher than the threshold voltage at which the p-type inversion layer is formed in the buffer region 30 and the drift region 32. The initial voltage (V0) is, for example, 0 V or a positive voltage.

By applying 0 V or a positive voltage to the backside gate electrode 52, the p-type inversion layer formed in the drift region 32 in contact with the backside gate insulating film 42 disappears. Therefore, the p-type collector region 26 and the p-type floating region 34 are electrically isolated.

In addition, in FIG. 5, a case where the time t2 is before the time t3 has been described as an example, but the time t2 may be the same as the time t3 in addition, the time t2 may be after the time t3.

The time length between the time t2 and the time t3 is, for example, 20 microseconds or less.

Next, the functions and effects of the semiconductor device according to the first embodiment will be described.

In order to realize low power consumption of the IGBT, it is preferable to reduce losses such as steady loss and turn-off loss. In order to reduce the steady loss, it is necessary to reduce the on-resistance of the IGBT. For example, it is considered to reduce the thickness of the drift region in order to reduce the on-resistance. However, in this case, the breakdown voltage of the IGBT is lowered. That is, the on-resistance and the breakdown voltage have a trade-off relationship.

In addition, in order to reduce the on-resistance, it is considered to use, for example, a trench gate structure. By using the trench structure, the carriers can be efficiently stored in the drift region, and thus, it is possible to reduce the on-resistance. However, in the case of sufficiently storing the carriers to realize low on-resistance, the amount of carriers to be discharged from the drift region at the time of turn off of the IGBT is increased. For this reason, the turn-off time is lengthened, and the turn-off loss is increased. That is, the on-resistance and the turn-off loss have a trade-off relationship.

In the IGBT 100 according to the first embodiment, in the OFF state, the p-type inversion layer is not formed in the buffer region 30 and the drift region 32 that are in contact with the backside gate insulating film 42. For this reason, the p-type collector region 26 and the p-type floating region. 34 are electrically isolated. Therefore, the effective thickness of the drift region is equal to the distance between the base region 36 and the p-type col lector region 26.

On the other hand, in the ON state of the IGBT 100, the p-type inversion layer is formed in the buffer region 30 and the drift region 32 which are in contact with the backside gate insulating film 42. For this reason, the p-type collector region 26 and the p-type floating region 34 are electrically connected, and thus, the p-type floating region 34 also functions as a hole injecting region like the p-type collector region. Therefore, the effective thickness of the drift region is equal to the distance between the base region 36 and the p-type floating region. 34, and the effective thickness becomes shorter than that of the case of the OFF state.

In the IGBT 100, the effective thickness of the drift region is changed between the case of the OFF state and the case of the ON state. In the case of the ON state, the effective thickness of the drift region becomes shorter than the case of the OFF state. Therefore, the trade-off relationship between the on-resistance and the breakdown voltage is improved. Therefore, it is possible to reduce the on-resistance of the IGBT 100 and to reduce the steady loss.

When the IGBT 100 is set to be in the turned-off state, the p-type inversion layer formed in the drift region 32 in contact with the backside gate insulating film 42 disappears. For this reason, the p-type collector region 26 and the p-type floating region 34 are electrically isolated.

By electrically isolating the p-type floating region 34, a path of the electrons to be discharged from the drift region 32 through the buffer region 30 and the n-type collector region 28 to the collector electrode 14 functions. That is, the effect of the anode short circuit in which the n-type drift region 32 and the collector electrode 14 are short-circuited becomes enhanced.

The discharge of carriers from the drift region 32 is facilitated. For this reason, the turn-off time becomes shortened. That is, the trade-off relationship between the on-resistance and the turn-off toss is improved. Therefore, it is possible to reduce the turn-off loss of the IGBT 100.

In the IGBT 100, the distance from the base region 36 to the p-type floating region 34 is shorter than the distance from the base region 36 to the n-type collector region 28. In other words, the p-type floating region 34 and the n-type collector region. 28 are apart from each other. Therefore, by providing the n-type collector region 28, the increase of the rise voltage of the turn-on current is less likely to occur. Therefore, the turn-on time is shortened, and thus, it is possible to reduce the turn-on loss.

In the IGBT 100, the p-type floating region 34 covers the corner of the backside gate trench 22. Therefore, at the time of the OFF state of the IGBT 100, the electric field strength applied to the backside gate insulating film 42 at the corner of the backside gate trench 22 is relaxed. Therefore, the backside improved.

From the viewpoint of facilitating the formation of backside gate trench 22, it is preferable that the depth of the backside gate trench 22 based on the second plane P2 as a reference is smaller than the depth of the frontside gate trench 21 based on the first plane P1 as a reference.

On the other hand, from the viewpoint of reducing the on-resistance of the IGBT 100, it is preferable that the depth of the backside gate trench 22 based on the second plane P2 as a reference is larger than the depth of the frontside gate trench 21 based on the first plane P1 as a reference.

From the viewpoint of increasing the amount of holes injected from the p-type floating region 34 at the time of the ON state of the IGBT 100, it is preferable that the p-type impurity concentration of the p-type floating region 34 is higher than the p-type impurity concentration of the base region 36.

As described above, according to the first embodiment, it is possible to realize the semiconductor device capable of reducing the steady loss and the turn-off loss.

Second Embodiment

A semiconductor device according to a second embodiment is different from the semiconductor device according to the first embodiment in that the semiconductor layer does not include the sixth semiconductor region of the second conductivity type being in contact with the second plane and being electrically connected to the second electrode. Hereinafter, in some cases, a portion of the description overlapping with that of the first embodiment will be omitted.

The semiconductor device according to the second embodiment is an IGBT 200 having a double-sided gate structure having gate electrodes on the frontside and backside of a semiconductor layer. In addition, the IGBT 200 has a trench gate structure in which frontside and backside gate electrodes are provided in a trench. Hereinafter, a case where the first conductivity type is p-type and the second conductivity type is n-type will be described as an example.

Figure 6:
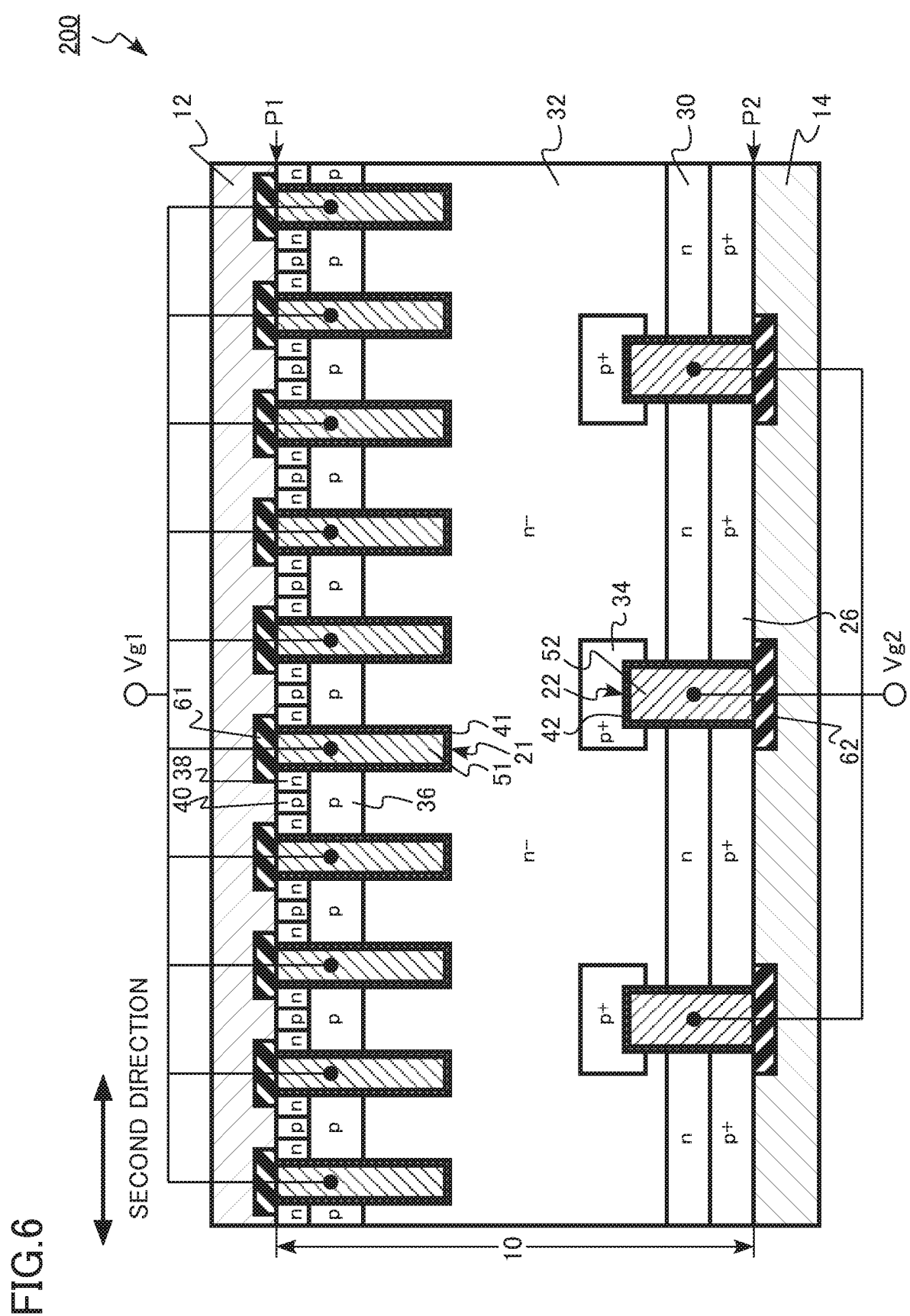
FIG. 6 is a schematic cross-sectional diagram of a portion of a semiconductor device according to a second embodiment.

FIG. 6 is a schematic cross-sectional diagram of a portion of the semiconductor device according to the second embodiment. FIG. 6 is a diagram corresponding to FIG. 1 of the first embodiment.

The IGBT 200 according to the second embodiment includes a semiconductor layer 10, an emitter electrode 12 (first electrode), a collector electrode 14 (second electrode), a frontside gate insulating film 41 (first gate insulating film), a backside gate insulating film 42 (second gate insulating film), electrode (first gate electrode), a backside gate electrode 52 (second gate electrode), a first interlayer insulating layer 61, and a second interlayer insulating layer 62.

In the semiconductor layer 10, a frontside gate trench. 21 (first trench), a backside gate trench 22 (second trench), a p-type collector region 26 (first semiconductor region), a buffer region 30 (seventh semiconductor region), adrift region 32 (second semiconductor region), a p-type floating; region 34 (fifth semiconductor region), a base region 36 (third semiconductor region), an emitter region 38 (fourth semiconductor region), and a contact region 40 are provided.

The semiconductor layer 10 of the IGBT 200 does not have the n-type collector region. 28 (sixth semiconductor region) that the semiconductor layer 10 of the IGBT 100 according to the first embodiment has.

According to the IGBT 200 of the second embodiment, similarly to the first embodiment, the effective thickness of the drift region is changed between the case of the OFF state and the case of the ON state. In the case of the ON state, the effective thickness of the drift region becomes shorter than that of the case of the OFF state. Therefore, the trade-off relationship between the on-resistance and the breakdown voltage is improved. Therefore, it is possible to reduce the on-resistance of the IGBT 200 and to reduce the steady loss.

As described above, according to the second embodiment, it is possible to realize a semiconductor device capable of reducing the steady loss.

Third Embodiment semiconductor device according to the third embodiment is different from the semiconductor device according to the first embodiment in that the first trench extends on the first plane in the first direction parallel to the first plane, and the second trench extends on the second plane in the second direction parallel to the first plane and perpendicular to the first direction. Hereinafter, in some cases, a portion of the description overlapping with that of the first embodiment will be omitted.

The semiconductor device according to the third embodiment is an IGBT 300 having a double-sided gate structure having gate electrodes on the frontside and backside of a semiconductor layer. In addition, the IGBT 300 has a trench gate structure in which frontside and backside gate electrodes are provided in a trench. Hereinafter, a case where the first conductivity type is p-type and the second conductivity type is n-type will be described as an example.

Figure 7:
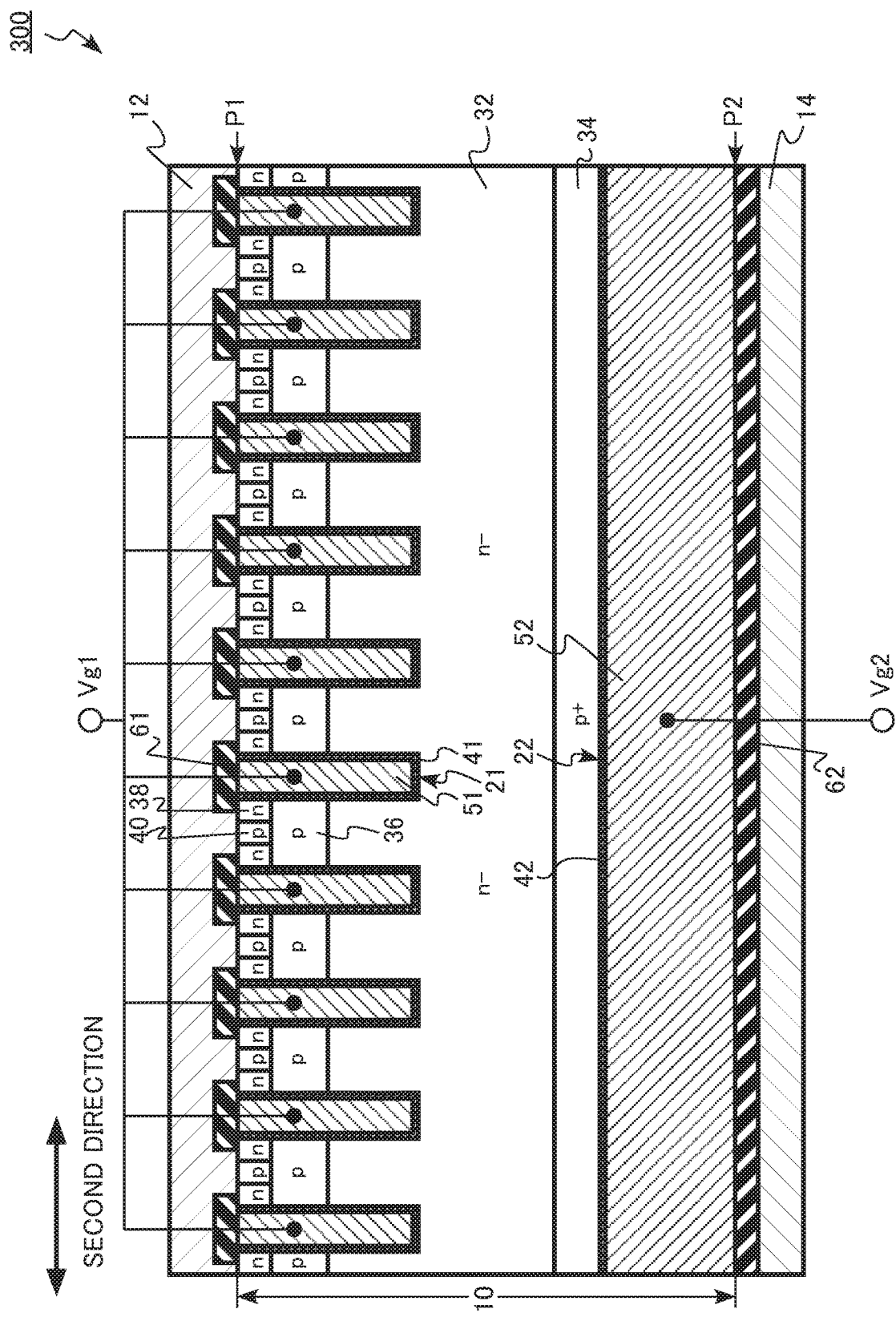
FIG. 7 is a schematic cross-sectional diagram of a portion of a semiconductor device according to a third embodiment.
Figure 8:
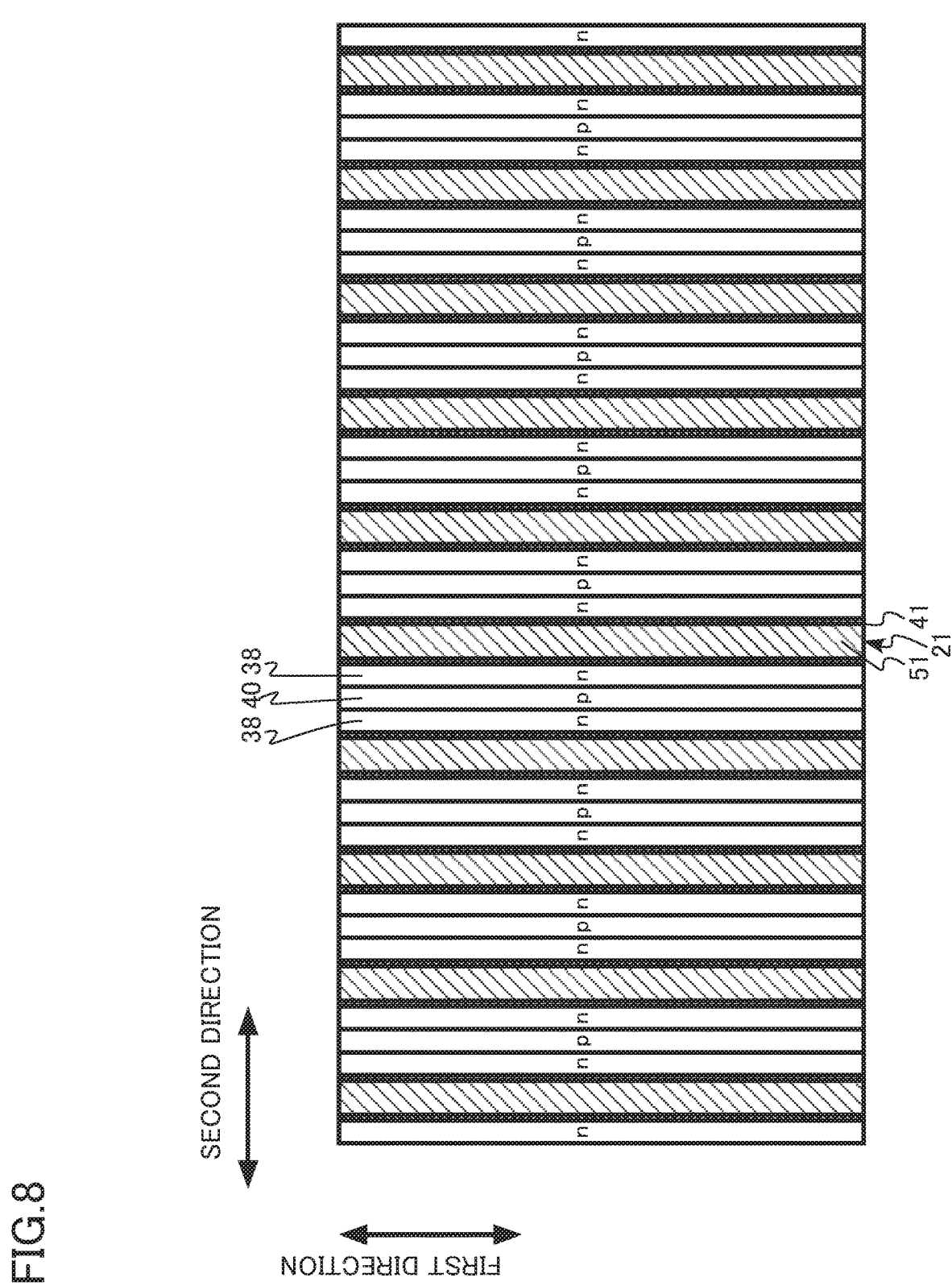
FIG. 8 is a schematic plan diagram of a portion of the semiconductor device according to the third embodiment.
Figure 9:
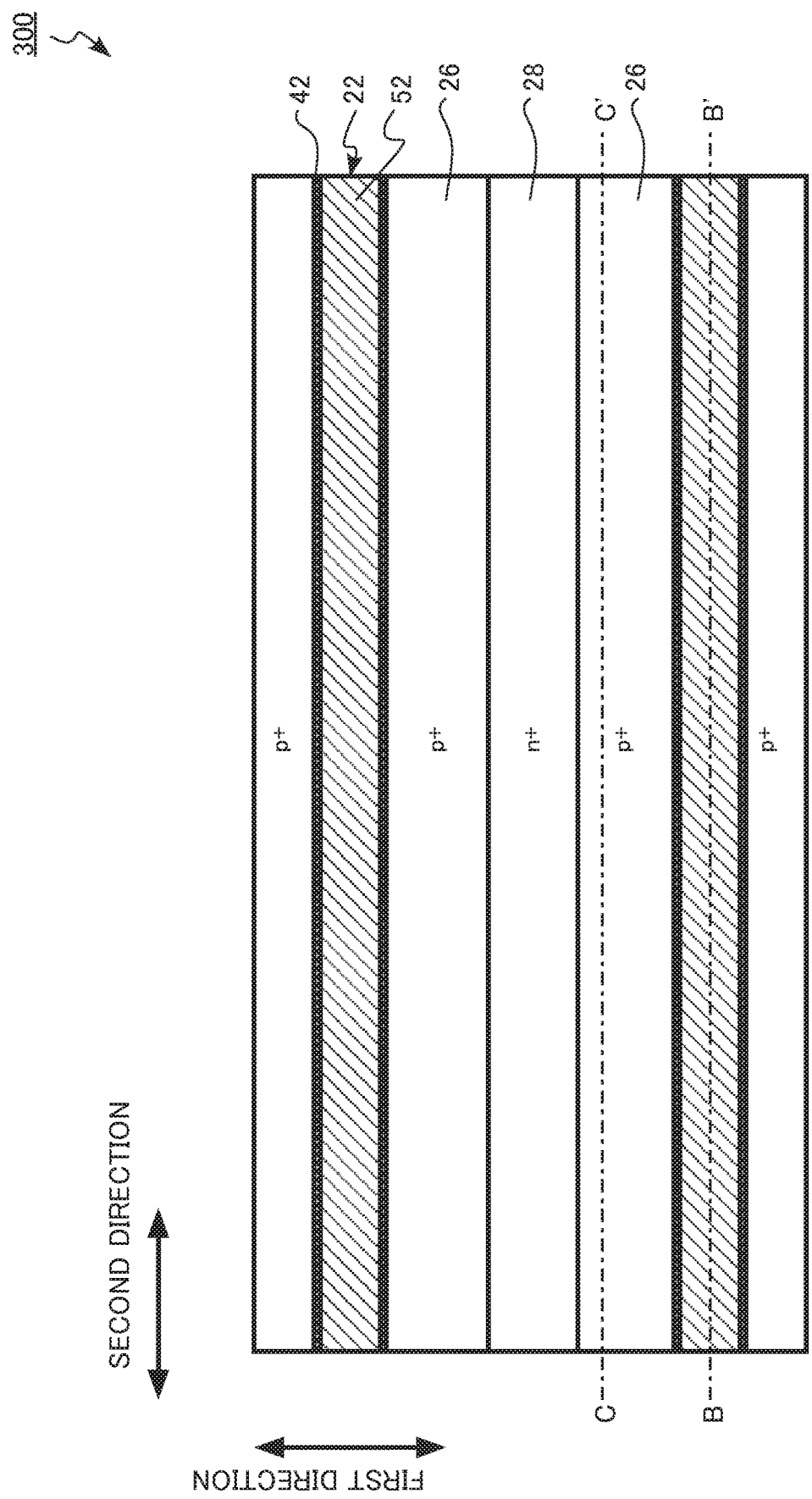
FIG. 9 is a schematic plan diagram of a portion of the semiconductor device according to the third embodiment.
Figure 10:
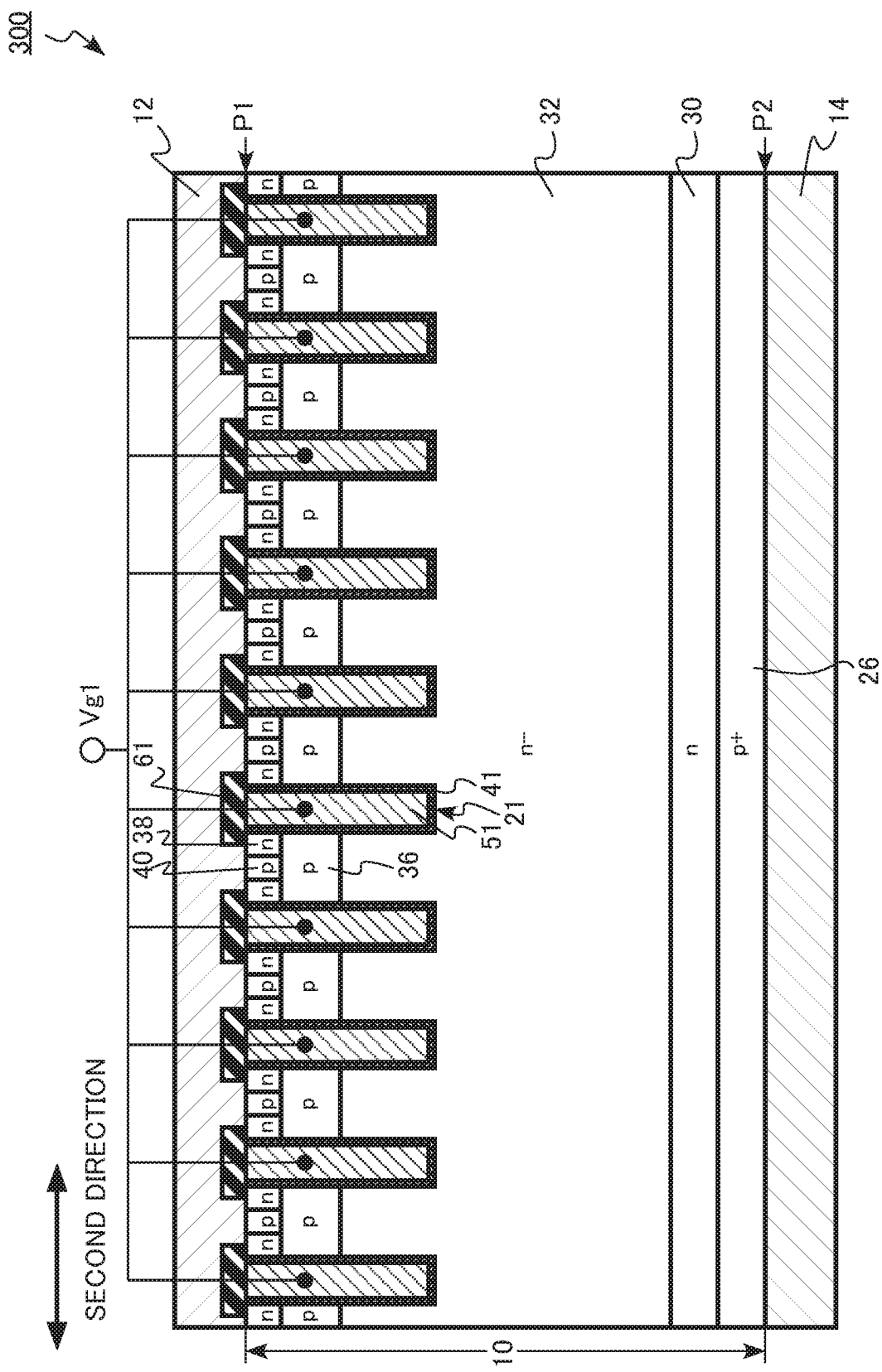
FIG. 10 is a schematic cross-sectional diagram of a portion of the semiconductor device according to the third embodiment.

FIG. 7 is a schematic cross-sectional diagram of a portion of the semiconductor device according to the third embodiment. FIGS. 8 and 9 are schematic plan diagrams of a portion of the semiconductor device according to the third embodiment. FIG. 10 is a schematic cross-sectional diagram of a portion of the semiconductor device according to the third embodiment.

FIG. 7 illustrates a cross section taken along the line BB' of FIG. 9. FIG. 8 is a plan diagram of the frontside, that is, the first plane P1 of the semiconductor layer. FIG. 9 is a plan diagram of the backside, that is, the second plane P2 of the semiconductor layer. FIG. 10 illustrates a cross section taken along the line CC' of FIG. 9.

The IGBT 300 according to the third embodiment includes a semiconductor layer 10, an emitter electrode 12 (first electrode) a collector electrode 14 (second electrode), frontside gate insulating film 41 (first gate insulating film), a backside gate insulating film 42 (second gate insulating film), a frontside gate electrode 51 (first gate electrode), a backside gate electrode 52 (second gate electrode), a first interlayer insulating layer 61, and a second interlayer insulating layer 62.

In the semiconductor layer 10, a frontside gate trench 21 (first trench), a backside gate trench 22 (second trench), a p-type collector region 26 (first semiconductor region), an n-type collector region 28 (sixth semiconductor region), a buffer region 30 (seventh semiconductor region), a drift region. 32 (second semiconductor region), a p-type floating region 34 (fifth semiconductor region), a base region 36 (third semiconductor region), an emitter region 38 (fourth semiconductor region), and a contact region 40 are provided.

The frontside gate trench 21 extends on the first plane P1 in the first direction parallel to the first plane P1. In addition, the backside gate trench 22 extends on the second plane P2 in the second direction parallel to the first plane and perpendicular to the first direction. The backside gate trench 22 extends in the direction perpendicular to the frontside gate trench 21.

The backside gate trench 22 extends in the direction perpendicular to the frontside gate trench 21, so that the flow of the on-current of the IGBT 300 becomes uniform. Therefore, local concentration of the ON current is unlikely to occur. Therefore, the reliability and the breakdown resistance of the IGBT 300 are improved.

As described above, according to the third embodiment, similarly to the first embodiment, it is possible to realize the semi conductor device capable of reducing the steady loss and the turn-off loss. Furthermore, it is possible to realize a semiconductor device with improved reliability and breakdown resistance.

Fourth Embodiment

A semiconductor device according to a fourth embodiment is different from the semiconductor device according to the first embodiment in that the semiconductor layer further includes a third trench provided on the side of the first plane, and the semiconductor device according to the fourth embodiment further includes a conductive layer provided in the third trench and electrically connected to the first electrode and an insulating film provided between the conductive layer and the second semiconductor region and between the conductive layer and the third semiconductor region. Hereinafter, in some cases, a portion of the description overlapping with that of the first embodiment will be omitted.

The semiconductor device according to the fourth embodiment is an IGBT 400 having a double-sided gate structure having gate electrodes on the frontside and backside of a semiconductor layer. In addition, the IGBT 400 has a trench gate structure in which frontside and backside gate electrodes are provided in the trench. Hereinafter, a case where the first conductivity type is p-type and the second conductivity type is n-type will be described as an example.

Figure 11:
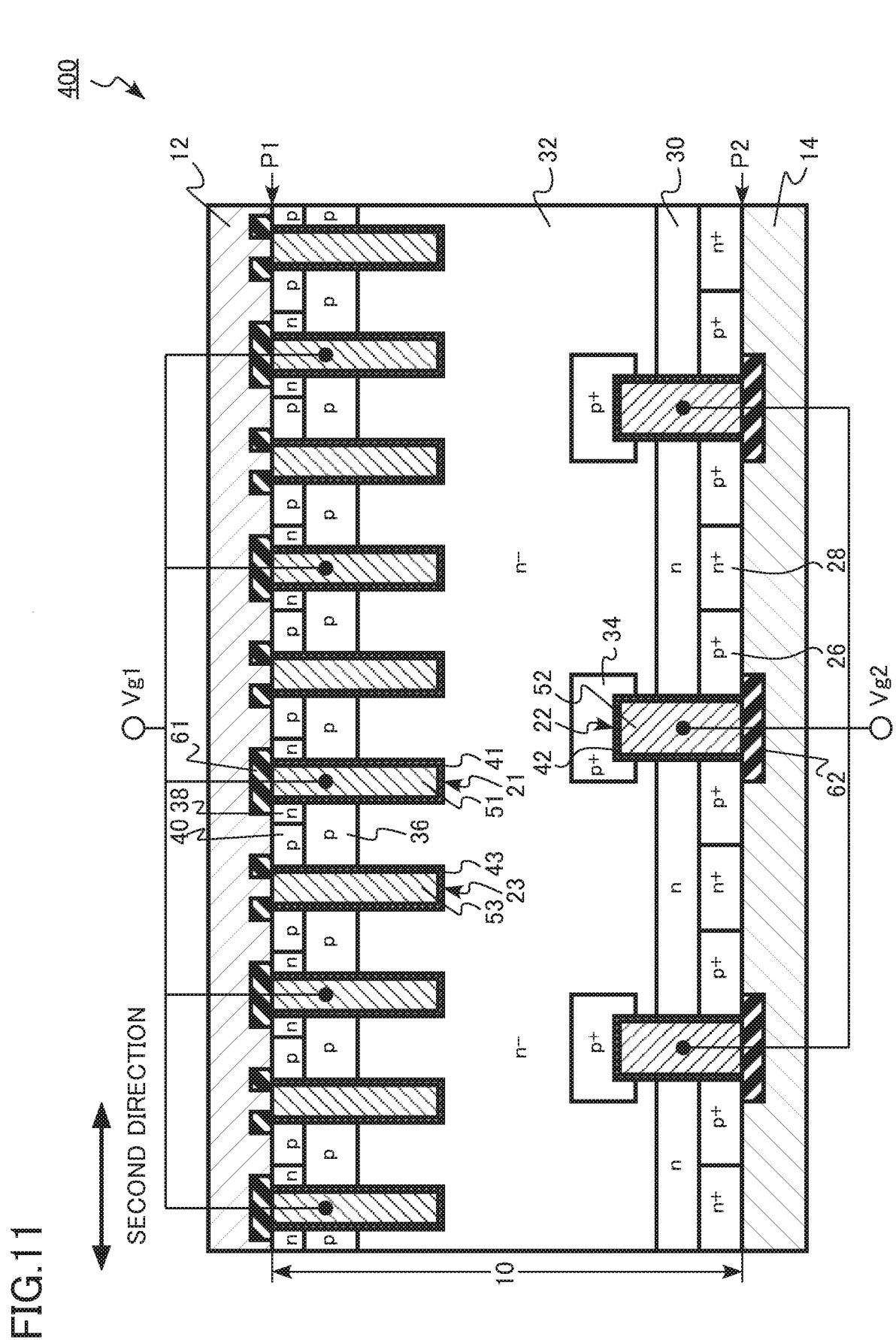
FIG. 11 is a schematic cross-sectional diagram of a portion of a semiconductor device according to a fourth embodiment.

FIG. 11 is a schematic cross-sectional diagram of a portion of the semiconductor device according to the fourth embodiment. FIG. 11 is a diagram corresponding to FIG. 1 of the first embodiment.

The IGBT 400 according the fourth embodiment includes a semiconductor layer 10, an emitter electrode 12 (first electrode), a collector electrode 14 (second electrode), a frontside gate insulating film 41 (first gate insulating film), a backside gate insulating film 42 (second gate insulating film), a dummy gate insulating film 43 (insulating film), a frontside gate electrode 51 (first gate electrode), a backside gate electrode 52 (second gate electrode), a dummy gate electrode 53 (conductive, a first interlayer insulating layer 61, and a second interlayer insulating layer 62.

In the semiconductor layer 10, a frontside gate trench 21 (first trench), a backside gate trench 22 (second trench) a dummy gate trench 23 (third trench), a p-type collector region 26 (first semiconductor region), an n-type collector region 28 (sixth semiconductor region), a buffer region 30 (seventh semiconductor region), a drift region 32 (second semiconductor region), a p-type floating region 34 (fifth semi conductor region), a base region 36 (third semiconductor region), an emitter region 38 (fourth semiconductor region), and a contact region. 40 are provided.

The dummy gate trench. 23 is provided on the side of the first plane P1 of the semiconductor layer 10. The dummy gate trench 23 is provided in contact with the base region 36.

The dummy gate trench 23 is a groove provided in the semiconductor layer 10. The dummy gate trench 23 is a portion of the semiconductor layer 10.

The dummy gate trench 23 extends on the first plane P1 in the first direction parallel to the first plane P1. The dummy gate trench 23 has a stripe shape. The plurality of dummy gate trenches 23 are repeatedly disposed in the second direction perpendicular to the first direction.

The dummy gate trench 23 is provided so as to be interposed between the two frontside gate trenches 21.

The dummy gate trench 23 penetrates the base region 36 and reaches the drift region 32. The depth of the dummy gate trench 23 based on the first plane P1 as a reference is, for example, 8 μm or less.

The dummy gate electrode 53 is provided in the dummy gate trench 23. The dummy gate electrode 53 is made of, for example, a semiconductor or a metal. The dummy gate electrode 53 is made of, for example, an amorphous silicon containing n-type impurities or p-type impurities or a polycrystalline silicon containing n-type impurities or p-type impurities.

The dummy gate electrode 53 is electrically connected to the emitter electrode 12. The dummy gate electrode 53 has the same electric potential as the emitter electrode 12.

The dummy gate insulating film 43 is provided between the dummy gate electrode 53 and the semiconductor layer 10. The dummy gate insulating film 43 is provided between the dummy gate electrode 53 and the drift region 32, between the dummy gate electrode 53 and the base region 36, and between the dummy gate electrode 53 and the contact region 40. The dummy gate insulating film 43 is in contact with the drift region 32, the base region 36, and the contact region 40. The dummy gate insulating film 43 is separated from the emitter region 38. The dummy gate insulating film 43 is made of, for example, a silicon oxide.

In the IGBT 400 according to the fourth embodiment, the dummy gate trench 23, the dummy gate insulating film 43, and the dummy gate electrode 53 are provided, so that it is possible to increase the amount of carriers stored in the drift region at the time of the ON state. Therefore, it is possible to reduce the on-resistance of the IGBT 400 and to reduce the steady loss.

As described above, according to the fourth embodiment, similarly to the first embodiment, it is possible to realize the semiconductor device capable of reducing the steady loss and the turn-off loss. Furthermore, it is possible to reduce the on-resistance and to reduce the steady loss.

Fifth Embodiment

A semiconductor circuit according to a fifth embodiment is different from the semiconductor device according to the first embodiment in that the semiconductor circuit according to the fifth embodiment includes a control circuit controlling the semiconductor device so that, when the turn-on voltage is applied to the first gate electrode, a negative voltage is applied to the second gate electrode in a case where the first conductivity type is p-type, and a positive voltage is applied to the second gate electrode in a case where the first conductivity type is n-type. Hereinafter, in some cases, a portion of the description overlapping with that of the first embodiment will be omitted.

Figure 12:
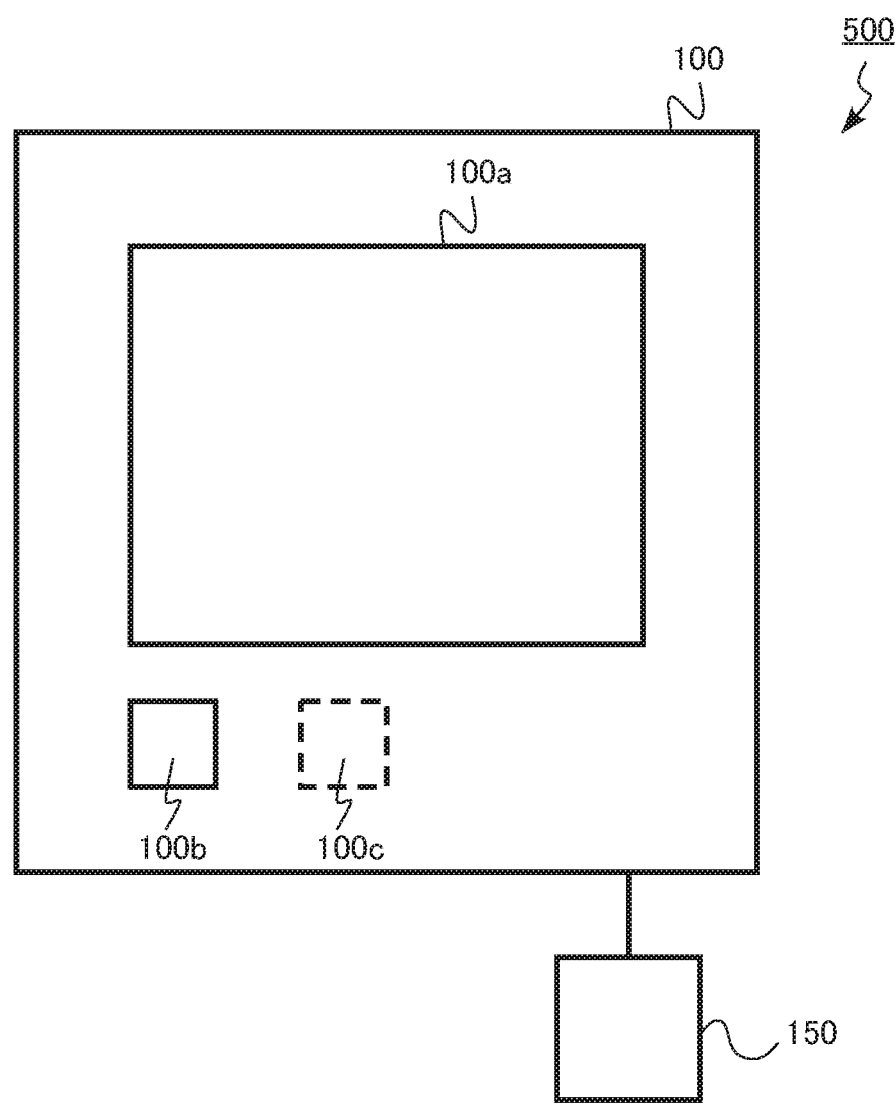
FIG. 12 is a schematic diagram of a semiconductor circuit according to a fifth embodiment.

FIG. 12 is a schematic diagram of the semiconductor circuit according to the fifth embodiment. The semiconductor circuit 500 according to the fifth embodiment includes the IGBT 100 according to the first embodiment and the control circuit 150. The semiconductor circuit 500 is, for example, a semiconductor module in which the IGBT 100 and the control circuit 150 are mounted.

The IGBT 100 includes a transistor region. 100*a*, a gate and a backside gate electrode pad 100*c*. The backside gate electrode pad 100*c* is located on the opposite surface semiconductor to the frontside gate electrode pad 100*b*.

The control circuit 150 controls the IGBT 100. The control circuit 150 is a gate driver circuit. The gate driver circuit controls voltages applied to the frontside gate electrode pad 100b and the backside gate electrode pad 100c. The gate driver circuit controls the first gate voltage (Vg1) applied to the frontside gate electrode 51 and the second gate voltage (Vg2) applied to the backside gate electrode 52.

The gate driver circuit controls the first gate voltage (Vg1) and the second gate voltage (Vg2) so that a negative voltage is applied to the backside gate electrode 52 when a turn-on voltage (Von) is applied to the frontside gate electrode 51.

As described above, according to the fifth embodiment, it is possible to realize a semiconductor circuit capable of reducing the steady loss and the turn-off loss.

In the first to fourth embodiments, a case where the semiconductor layer is single crystal silicon has been described as an example, but the semiconductor layer is not limited to the single crystal silicon. For example, other single crystal semiconductors such as a single crystal silicon carbide may be used.

In the first, second, and fourth embodiments, a case where both the frontside gate trench 21 and the backside gate trench 22 have a stripe shape has been described as an example, but the shapes of the frontside gate trench 21 and the backside gate trench 22 are not limited to the stripe shape. For example, one or both of the frontside gate trench 21 and the backside gate trench 22 may have a shape other than the stripe shape such as a polygonal shape.

In the first to fifth embodiments, a case where the first conductivity type is p-type and the second conductivity type is n-type has been described as an example, but the first conductivity type may also be n-type, and the second conductivity type may also be p-type. In a case where the first conductivity type is n-type and the second conductivity type is p-type, for example, the second voltage (V2) is a positive voltage.

In the first to fourth embodiments, a case where the distance between the buffer region 30 and the base region 36 is longer than the distance between the p-type floating region 34 and the base region 36 has been described as an example, but the distance between the buffer region 30 and the base region 36 may also be allowed to be shorter than the distance between the p-type floating region 34 and the base region 36. In this case, the p-type floating region 34 is surrounded by the buffer region 30.

In the fifth embodiment, a case where the semiconductor device is the semiconductor device according to the first embodiment has been described as an example, but the semiconductor device may be the semiconductor device according to the first to fourth embodiments.

While certain embodiments have been described, these embodiments have been presented by way of example only, and are not intended to limit the scope of the inventions. Indeed, semiconductor devices and semiconductor circuits described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer including a first plane and a second plane facing the first plane, the semiconductor layer including:
at least one first trench provided on a side of the first plane;
at least one second trench provided on a side of the second plane;
a first semiconductor region of a first conductivity type being in contact with the second plane;
a second semiconductor region of a second conductivity type provided between the first semiconductor region and the first plane;
a third semiconductor region of the first conductivity type provided between the second semiconductor region and the first plane;
a fourth semiconductor region of the second conductivity type provided between the third semiconductor region, and the first plane; and
a fifth semiconductor region of the first conducti ty type provided between the at least one second trench and the third semiconductor region, being separated from the third semiconductor region and the first semiconductor region, and being in contact with the at least one second trench;
a first gate electrode provided in the at least one first trench;
a first gate insulating film provided between the first gate electrode and the second semiconductor region, between the first gate electrode and the third semiconductor region, and between the first gate electrode and the fourth semiconductor region;
a second gate electrode provided in the at least one second trench;
a second gate insulating film provided between the second gate electrode and the first semiconductor region, and between the second gate electrode and the fifth semiconductor region;
a first electrode provided on the side of the first plane of the semiconductor layer and being electrically connected to the fourth semiconductor region; and
a second electrode provided on the side of the second plane of the semiconductor layer and being electrically connected to the first semiconductor region.

2. The semiconductor device according to claim 1, wherein the semiconductor layer further includes a sixth semiconductor region of the second conductivity type being in contact with the second plane and being electrically connected to the second electrode.

3. The semiconductor device according to claim 1, wherein the at least one first trench extends on the first plane in a first direction parallel to the first plane, and wherein the at least one second trench extends on the second plane in a second direction parallel to the first plane and perpendicular to the first direction.

4. The semiconductor device according to claim 1, wherein the semiconductor layer further includes at least one third trench provided on the side of the first plane, and
wherein the semiconductor device further comprises:
a conductive layer provided in the at least one third trench and being electrically connected to the first electrode; and
an insulating film provided between the conductive layer and the second semiconductor region and between the conductive layer and the third semiconductor region.

5. The semiconductor device according to claim 1, wherein the semiconductor layer further includes a seventh semiconductor region of the second conductivity type provided between the first semiconductor region and the second semiconductor region and having a second conductivity type impurity concentration higher than a second conductivity type impurity concentration of the second semiconductor region.

6. The semiconductor device according to claim 5, wherein the fifth semiconductor region is surrounded by the seventh semiconductor region.

7. The semiconductor device according to claim 1, wherein a second conductivity type impurity concentration of the fifth semiconductor region is higher than a second conductivity type impurity concentration of the third semiconductor region.

8. The semiconductor device according to claim 1, wherein the first semiconductor region is in contact with the at least one second trench.

9. The semiconductor device according to claim 1, wherein the at least one first trench includes a plurality of first trenches, the at least one second trench includes a plurality of second trenches, a pitch of the second trenches in the second direction is larger than a pitch of the first trenches in the second direction.

10. A semiconductor circuit comprising:
   the semiconductor device according to claim 1; and
   a control circuit controlling the semiconductor device so that, when a turn-on voltage is applied to the first gate electrode, a negative voltage is applied to the second gate electrode in a case where the first conductivity type is p-type, and a positive voltage is applied to the second gate electrode in a case where the first conductivity type is n-type.

* * * * *